(12) United States Patent
Pekny et al.

(10) Patent No.: US 8,103,936 B2
(45) Date of Patent: Jan. 24, 2012

(54) SYSTEM AND METHOD FOR DATA READ OF A SYNCHRONOUS SERIAL INTERFACE NAND

(75) Inventors: Theodore T. Pekny, Sunnyvale, CA (US); Victor Y. Tsai, Palo Alto, CA (US); Peter S. Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1133 days.

(21) Appl. No.: 11/873,833

(22) Filed: Oct. 17, 2007

(65) Prior Publication Data

US 2009/0103380 A1 Apr. 23, 2009

(51) Int. Cl.
*G11C 29/00* (2006.01)
(52) U.S. Cl. ...................................... 714/763
(58) Field of Classification Search .................. 714/763
See application file for complete search history.

(56) References Cited

U.S. PATENT DOCUMENTS

| | | | | |
|---|---|---|---|---|
| 6,223,322 | B1* | 4/2001 | Michigami et al. | 714/769 |
| 7,515,831 | B2* | 4/2009 | Lee et al. | 398/135 |
| 7,861,122 | B2* | 12/2010 | Cornwell et al. | 714/42 |
| 2004/0003168 | A1 | 1/2004 | Kim et al. | |
| 2004/0153902 | A1* | 8/2004 | Machado et al. | 714/710 |
| 2006/0236204 | A1* | 10/2006 | Lee et al. | 714/763 |
| 2007/0115743 | A1 | 5/2007 | Sartori et al. | |
| 2007/0124544 | A1 | 5/2007 | Dressier et al. | |

FOREIGN PATENT DOCUMENTS

| | | |
|---|---|---|
| EP | 1367496 | 12/2003 |
| EP | 1764803 | 3/2007 |

OTHER PUBLICATIONS

Sang Lyul Min, et al.; Evolution of NAND Flash Memory Interface; vol. 4697/2007, Aug. 21, 2007; pp. 75-79.
"ATMEL High Speed Small Sectored SPI Flash Memory AT25FS010," Aug. 2007, http://www.atmel.com/dyn/resources/prod_documents/docs5167.pdf.
Sang Lyul Min, Eyee Hyun Nam, and Young Hee Lee; "Evolution of NAND Flash Memory Interface"; Lecture Notes in Computer Science-Advances in Computer Systems Architecture; Aug. 21, 2007, pp. 75-79; vol. 4697/12007; Springer-Verland Berlin Heidelberg.
U.S. Appl. No. 11/873,816, filed Oct. 17, 2007, Pekny et al.
U.S. Appl. No. 11/873,826, filed Oct. 17, 2007, Pekny et al.
U.S. Appl. No. 11/873,805, filed Oct. 17, 2007, Pekny.
Micron Technical Note TN-28-01 Boot Block Flash Memory Technology FT01 p. 65—Rev. 12/99.
Micron Technical Note TN-28-02 Bulk Erase to Boot Block Conversion FT02 p. 65—Rev. 12/99.
Micron Flash Memory MT28F008B3 MT28F800B3 3v Only, Dual Supply (Smart 3) Q10.fm—Rev. E 6/04 EN.

(Continued)

*Primary Examiner* — James C Kerveros
(74) *Attorney, Agent, or Firm* — Fletcher Yoder

(57) ABSTRACT

A method and system is disclosed for operating a NAND memory device. The NAND memory device is operated by transmitting serial peripheral interface signals from a host to a NAND memory device, whereby the signals are communicated to a NAND memory in the NAND memory device without modifying the signals into a standard NAND memory format. Similarly, a method and system is disclosed for receiving signals from the NAND memory device without modifying the signals from a standard NAND format into a serial format. The system also incorporates error detection and correction techniques to detect and correct errors in data stored in the NAND memory device.

25 Claims, 6 Drawing Sheets

OTHER PUBLICATIONS

Micron Technical Note NAND Flash Security TN-2911__nand__security.fm—Rev. B 5/07 EN http://download.micron.com/pdf/technotes/nand/tn2911.pdf.

TMS 320x28xx, 28xxx DSP Serial Peripheral Interface (SPI) Reference Guide Literature No. SPRU059D Jun. 2002—Revised Nov. 2006.

Micron NAND Flash Memory MT29F4G08AAA, MT29F4G08BAA, MT29F4G08DAA, MT29F16G08FAA 4gb__nand__m4oa__1.fm—Rev. B 2/07 EN.

Open NAND Flash Interface Specification Revision 1.0 28—Dec. 2006.

* cited by examiner

SYSTEM AND METHOD FOR DATA READ OF A SYNCHRONOUS SERIAL INTERFACE NAND

BACKGROUND

1. Field of the Invention

Embodiments of the invention relate generally to a Serial Peripheral Interface for connecting a host device to memory devices.

2. Description of the Related Art

A serial peripheral interface bus (SPI) is a four wire serial communication interface that enables a serial data link between two devices, a master and a slave. It provides support for a low to medium bandwidth network connection between the devices supporting the SPI. Since SPI utilizes only four wires for communication, SPI has become popular for use in systems that require relatively simple IC packages.

The four wires of the SPI include of two control lines and two data lines. The control lines of the SPI include a Chip Select (CS) line and a Serial Clock (SCK) line. While more than one slave device can be connected to the master device, only one slave device may be accessed at any given time. This selection is accomplished by use of the CS line. A CS signal is outputted from the master and allows for activation and deactivation of a slave device by the master device. Every slave device requires a separate CS line for activation. Thus, if ten slave devices exist on the network, there are ten independent chip select lines, one chip select line per slave device.

The master device also provides the serial clock. The SCK is used to clock the shifting of serial data into and out of the master and slave devices. Use of this clock allows SPI architecture to operate in a master/slave full duplex mode, where data is transferred simultaneously from one device acting as a master to a second device acting as a slave.

The data lines of the SPI include a Serial Data In (SI) line and a Serial Data Out (SO) line. The SI line is a data communication line that outputs data from the master device to the slave device. The SO line is a second data communication line used to output data from the slave device to the master device. Both data lines are active only when CS is selected for the specified slave device.

SPI has been used with memory devices such as EEPROM and NOR flash memory. NOR flash memory is a popular and fairly inexpensive memory device. NOR flash memory provides full address and data buses, thereby allowing random access to any memory location. Moreover, typically in NOR flash memory, there is no need for error correction capabilities. This is because the NOR flash memory typically has good reliability without the use of error correction systems. However, a downside of NOR flash memory is that it experiences long erase and write times.

NAND flash memory has faster erase times than NOR flash memory. It also requires smaller chip area per cell than NOR flash memory, leading to greater storage density than that available in NOR flash memory. NAND flash memory also has up to ten times more endurance than conventional NOR flash memory. However, NAND flash memory typically requires some error detection and correction capabilities. Moreover, NAND flash memory does not directly allow for random data access.

Instead of being randomly accessible, like the NOR flash memory, the NAND memory array is made up of many pages of data. To access any specific data location in the array, the corresponding page associated with that data location must be accessed. The page accessed is typically read into a page cache, which can then be accessed for any specific data in the page.

Due to the differences between NOR flash memory devices and NAND flash memory devices, a SPI system configured for use with a NOR flash memory device does not accommodate a NAND flash memory device. Thus, there is a need for a SPI system configured specifically for use with a NAND flash memory device. Embodiments of the invention may be directed to one or more of the problems set forth above.

DETAILED DESCRIPTION OF SPECIFIC EMBODIMENTS

Figure 1:
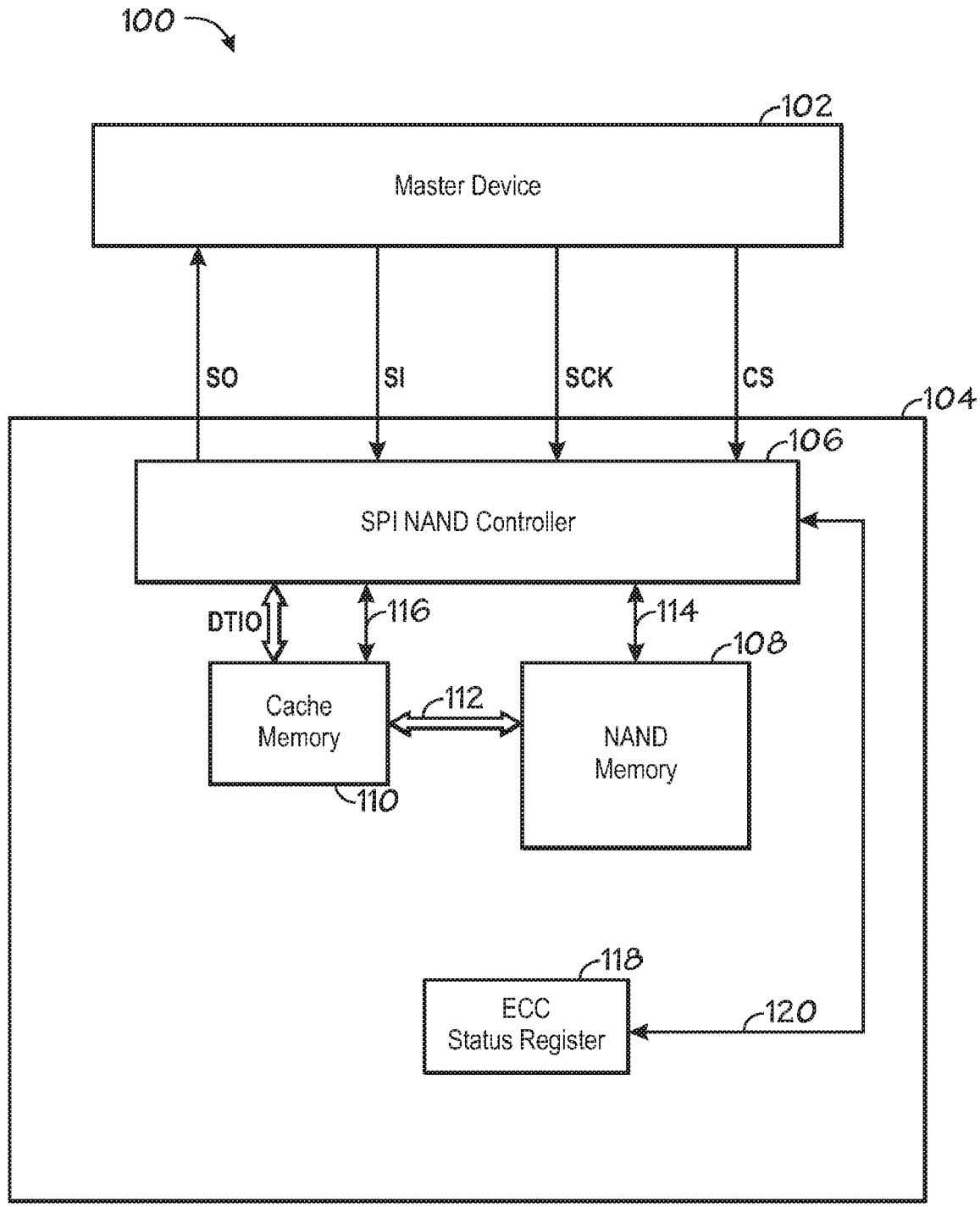
FIG. 1 is a block diagram of a memory device utilizing a serial peripheral interface system in connection with a NAND memory.

Turning now to the drawings, and referring initially to FIG. 1, a block diagram depicting an embodiment of a memory system utilizing a serial peripheral interface system in connection with a NAND memory, generally designated by reference numeral 100, is illustrated. The memory system 100 may be usable in any of a variety of applications, such as, a computer, pager, cellular phone, personal organizer, portable audio player, control circuit, camera, etc. The memory system 100 may include a master device 102 and a slave device 104. While more than one slave device 104 can be controlled by the master device 102, for simplicity, only one slave device 104 is illustrated in FIG. 1. In a typical system, the master device 102 operates by sending signals to, and receiving signals from, the slave device 104.

The communication bus in the memory system 100 between the master device 102 and the slave device 104 is a serial peripheral interface bus (SPI). The operating signals used to communicate between the master device 102 and the slave device 104 include two control lines and two data lines. The control lines of the SPI include a Chip Select (CS) line and a Serial Clock (SCK) line. The CS signal is outputted from the master device 102 and is received by the slave device 104, and allows for activation and deactivation of the slave device 104 by the master device 102. The CS line is typically active low. The SCK signal is outputted from the master device 102 and provides a clock to the slave device 104. The SCK signal clocks the slave device 104 regardless of whether the slave device 104 is activated by the CS line or not.

The data lines of the memory device include a Serial Data In (SI) line and a Serial Data Out (SO) line. The SI line is a data communication line that carries signals from the master device 102 to the slave device 104. The SO line is a second data communication line. The SO line is used to output signals from the slave device 104 to the master device 102. Both data lines are active only when the CS line has been activated, that is, when the CS signal is low.

Control lines CS and SCK, as well as data line SI, carry signals from the master device 102 to the serial peripheral interface (SPI) NAND controller 106, located in the slave device 104. Similarly, data line SO carries signals from the SPI NAND controller 106 to the master device 102. The SPI NAND controller 106 also transmits signals from the data line SI to the NAND memory 108, via the cache memory 110 along a data input output line (DTIO), and receives signals from cache memory 110 along the DTIO data line. The signals received by the NAND memory 108 are in a modified SPI NAND format. Thus, the signals sent to the NAND memory 108 do not include typical standard NAND format signals such as command latch enable, address latch enable, read enable, write enable, ready/busy, and chip enable. Instead, the signals are transmitted in a modified SPI NAND format. In one embodiment, the modified SPI NAND format signals include specially programmed hexagonal operation signals.

The NAND memory 108 includes a memory cell array which can be broken into blocks. These blocks typically consist of pages of data. Typical groupings include 64 pages of 2048 bytes per page, plus an additional 64 bytes for spare data. Other groupings can include 4096 bytes per page or 8192 bytes per page, with corresponding numbers of page groupings and corresponding additional bytes for spare data. Thus, each page typically has a spare region containing a number of bytes associated with the page. These spare region bytes are normally used for error correction (ECC) purposes. Normally there are between 8 and 256 ECC bytes associated with each page. As described above, the NAND memory 108 typically receives signals from cache memory 110. That is, the SI line inputs data into the NAND memory 108, via the cache memory 110 along the DTIO line, without transformation of the data or control signals into standard NAND format.

Data is read out of the NAND memory 108 a full page at a time. The selected page that includes data to be accessed by the master device 102 is read out of the NAND memory 108 and transmitted to the cache memory 110 across data line 112. Typically, the cache memory 110 is equivalent in size to the page accessed in the NAND memory 108. The cache memory 110 also includes a small spare region useable to store bytes associated with the page accessed. One embodiment includes a memory cache 110 that holds 2048 bytes of data plus an additional spare storage region of 64 bytes.

Data stored in the cache memory 110 is accessed by the master device 102 through the SPI NAND controller 106. The cache memory 110 outputs data on the DTIO line to the SPI NAND controller 106 as SPI NAND format data. The SPI NAND controller 106 functions to transmit the output signal along the SO line to the master device 102. This transmission of the output signal is based on the input data commands and control signals received from the master device 102 along the SI line.

The SPI NAND controller 106 also may communicate with the NAND memory 108 along an access line 114. This access line 114 can be used to access the pages directly, as well as to access the ECC blocks. Similarly, the SPI NAND controller 106 also may communicate with cache memory 110 along an access line 116. This access line 116 can be used to access the stored data directly, as well as to access any spare regions. In one embodiment, the access line 116 may be used to transmit and receive error correction and detection information for the cache memory 110.

The slave device 104 may also include an ECC status register 118. This ECC status register 118 is accessed by the SPI NAND controller 106 along an access line 120. Although, in FIG. 1, the ECC status register 118 is shown to be external to the SPI NAND controller 106, the ECC status register 118 may be incorporated internally into the SPI NAND controller 106. The ECC status register 118 may also include a group of sub-registers. These sub-registers may include an ECC enable/disable register that allows for optional ECC for the memory device data, an ECC type register that stores the total number of errors detected, or an ECC cache memory result register that stores information regarding the result of any error correction process on the cache memory 110. The ECC status register 118 may include all of the preceding ECC sub-registers or any combination of the preceding sub-registers.

Figure 2A:
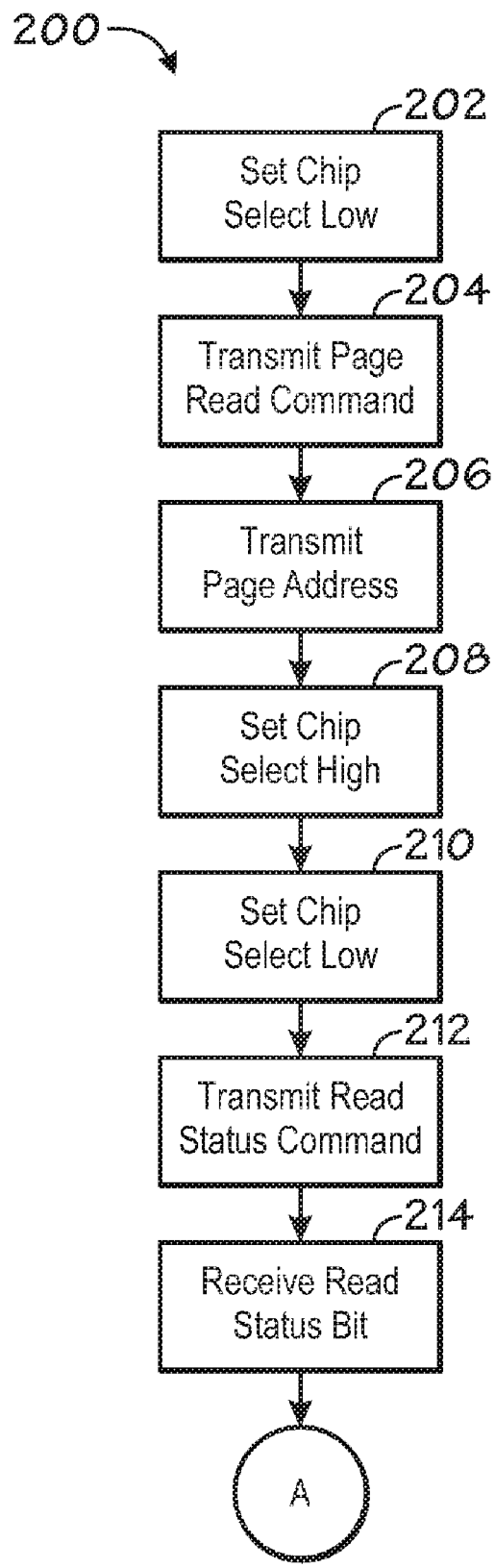
FIG. 2A is a flow chart illustrating a method for a master device to access a NAND memory device in accordance with embodiments of the invention.
Figure 2B:
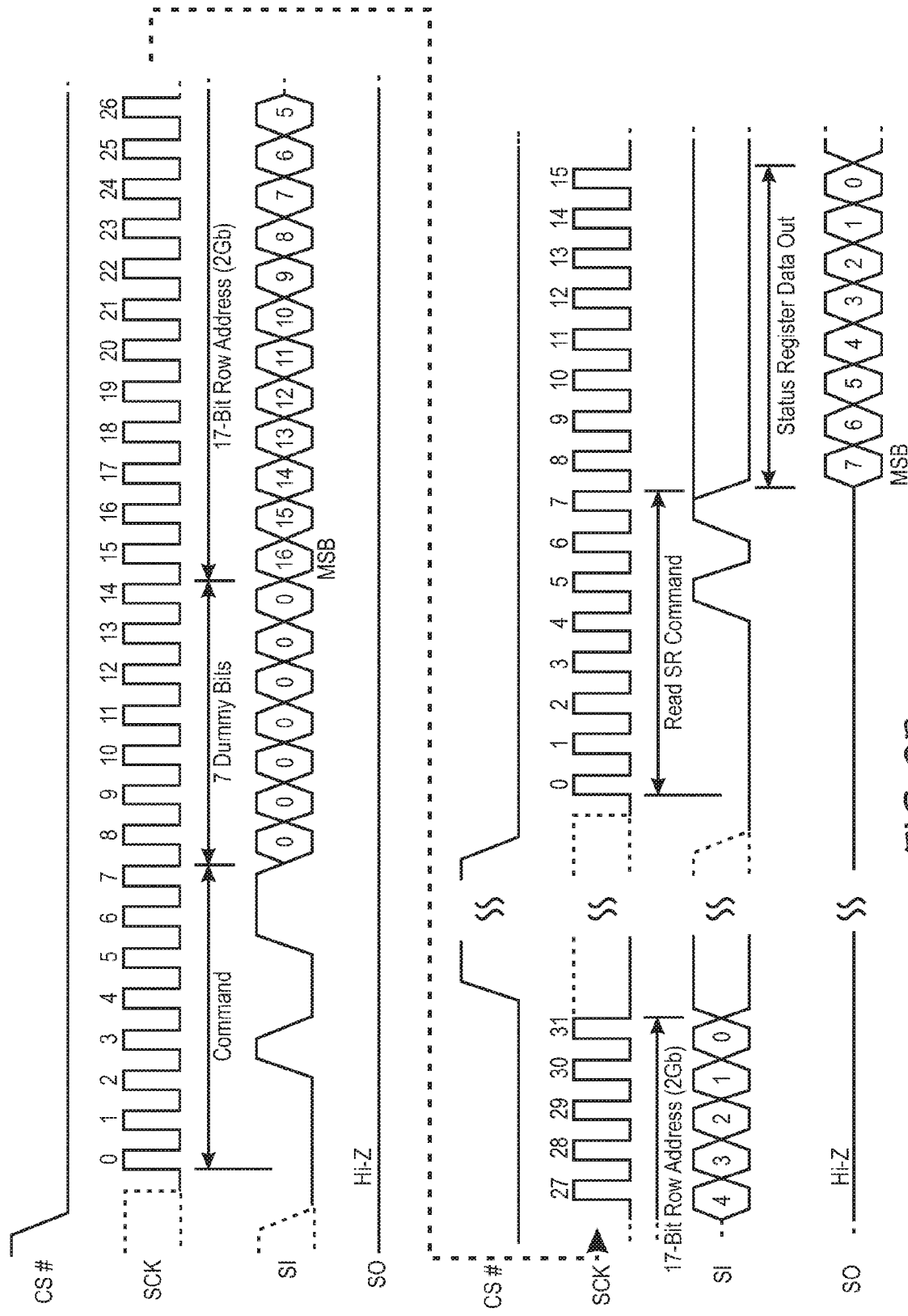
FIG. 2B is a timing diagram corresponding to the method for a master device to access a NAND memory device in accordance with FIG. 2A.

Turning now to FIG. 2A, a flow chart is illustrated that describes the process 200 undertaken by the master device 102 to transmit a page read command to the slave device 104. FIG. 2B illustrates a timing diagram corresponding to the flow chart of FIG. 2A. At step 202 of FIG. 2A, the CS line is set to low by the master device 102, thus selecting the slave device 104 for information transmittal. This is illustrated in FIG. 2B with CS# switching low. In step 204 of FIG. 2A, the master device 102 transmits a page read command to the slave device 104 on the SI line. The page read command operates to initialize the slave device 104 for a data read mode. This is shown in FIG. 2B by the first command illustrated on the SI line. Next, in step 206 of FIG. 2A, the master device 102 transmits a page address to the slave device 104 across the SI line. In one embodiment, dummy bits may be transmitted as a header to the address transmitted to allow for proper byte alignment. For example, if a 17 bit row address is being transmitted, then a 7 bit dummy header may be transmitted so that the entire address length conforms to the slave device data input length requirements. This is illustrated in FIG. 2B by the 7 dummy bits preceding the 17 bit address. Once the page address is transmitted, the master device 102 sets the CS value to high in step 208 of FIG. 2A. This deactivates the communication link between the master device 102 and the slave device 104. This is illustrated in FIG. 2B with CS# switching high after the addresses are entered.

During the time that CS is set high, the slave device 104 performs internal operations such as accessing the proper page from the NAND memory 108, transferring the selected page to memory cache 110, and performing any error detection and correction of data in the memory cache 110. In step 210 of FIG. 2A, as well as illustrated in FIG. 2B, the CS line is again set to low by the master device 102, thus selecting the slave device 104 for information transmittal. In step 212 of FIG. 2A, the master device 102 transmits a read status command to the slave device 104 on the SI line. The read status command operates to align the data transmission between the master device 102 and the slave device 104. This is represented in FIG. 2B by the Read SR Command shown on the SI line. The master device 102 issues a read status command until the slave device 104 sends a status bit on SO that signifies the internal page read operation is complete, as illustrated on the SO line of FIG. 2B. This signals to the master device 102 that the page of the NAND memory 108 accessed by the page read process is stored in the cache memory 110, and is ready to be accessed by the master device 102.

Figure 3:
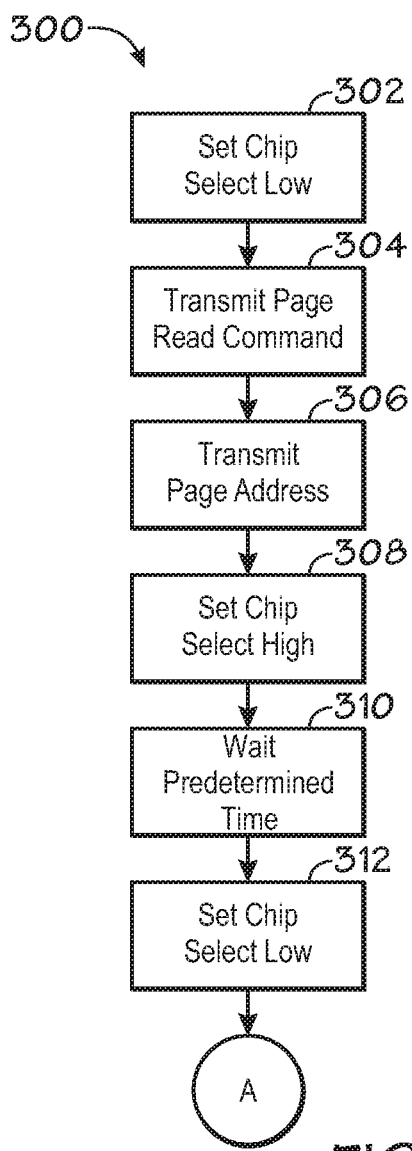
FIG. 3 is a flow chart illustrating a second method for a master device to access a NAND memory device in accordance with embodiments of the invention.

In FIG. 3, a flow chart illustrating a second embodiment of the page read process 300 undertaken by the master device 102 to transmit a page read command to the slave device 104. At step 302, the CS is set to low by the master device 102, thus selecting the slave device 104 for information transmittal. In step 304, the master device 102 transmits a page read command to the slave device 104 on the SI line. The page read command operates to initialize the slave device 104 for a data read mode. Next, in step 306, the master device 102 transmits a page address to the slave device 104 across the SI line. In one embodiment, dummy bits may be transmitted as a header to the address transmitted to allow for proper byte alignment. For example, if a 17 bit row address is being transmitted, then a 7 dummy bit header may be transmitted so that the entire address length conforms to the slave device data input length requirements. Once the page address is transmitted, the master device 102 sets the CS value to high in step 308. This deactivates the communication link between the master device 102 and the slave device 104.

The master device 102 waits a predetermined period of time in step 310 for the slave device 104 to perform its internal operations. During the wait time, the slave device 104 performs internal operations such as accessing the proper page from the NAND memory 108, transferring the selected page to memory cache 110, and performing any error detection and correction of data in the memory cache 110. The predetermined wait time in step 310 is equivalent to the total time of the internal operations of the slave device 104. This is a predefined number that is based both on the period of the SCK, and on the internal operations to be performed by the slave device. In step 312, the CS is again set to low by the master device 102, thus selecting the slave device 104 for information transmittal.

Figure 4A:
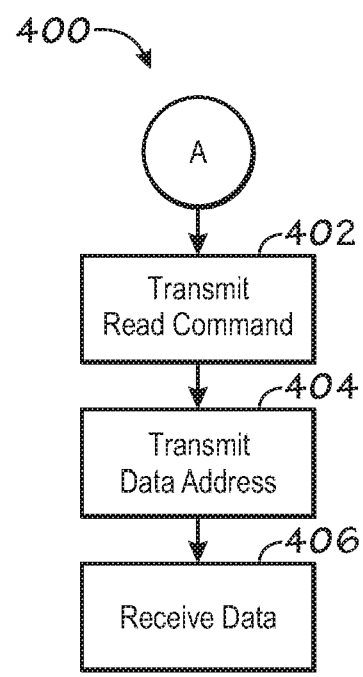
FIG. 4A is a flow chart illustrating a method for a page read by a master device of a NAND memory device in accordance with embodiments of the invention.
Figure 4B:
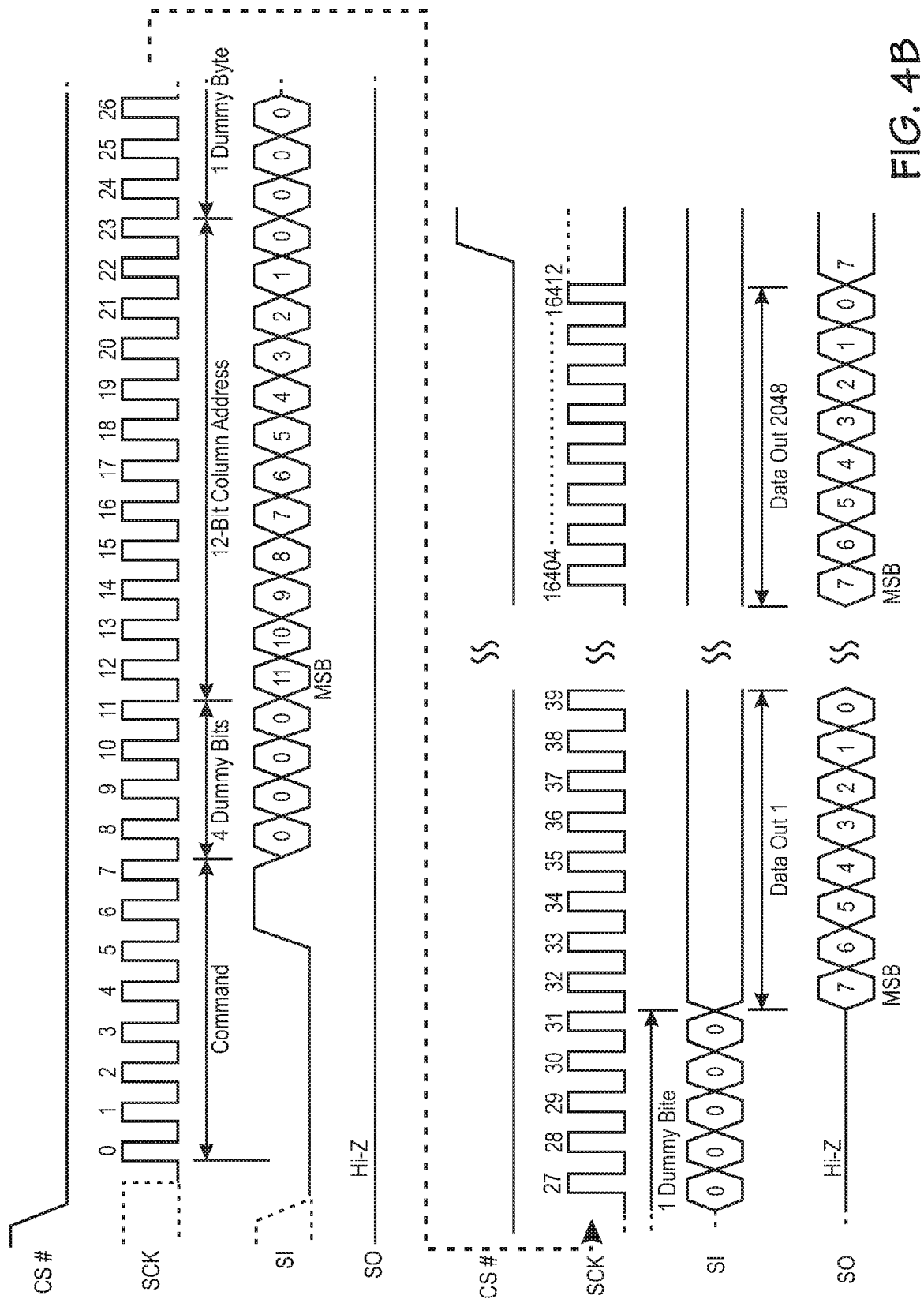
FIG. 4B is a timing diagram corresponding to the method for a page read by a master device of a NAND memory device in accordance with FIG. 4A.

The embodiment described in FIG. 2A and the embodiment described in FIG. 3 both include steps that culminate in the random data read of FIG. 4A. FIG. 4B illustrates a corresponding timing diagram to the flow chart of FIG. 4A. Once the page read process is complete, either because the master device 102 has received a read status bit (FIG. 2A) or because a predetermined time has elapsed (FIG. 3), the master device transmits a data read command on the SI line in step 402 of FIG. 4A. This is also shown in FIG. 4B by the first command illustrated on the SI line. This data read command allows for data to be read from the cache in a random access method. For example, a single byte can be read, a single word can be read, or the entire page can be read starting either at the first byte of the page or starting at any address on the page with a loop-around feature that allows the remainder of the page to be read.

At step 404 of FIG. 4A, the master device 102 transmits the data address to be accessed. In one embodiment, dummy bits may be transmitted as a header to the address transmitted to allow for proper byte alignment. For example, if a 12 bit column address is being transmitted, then a 4 bit dummy header may be transmitted so that the entire address length conforms to the slave device data input length requirements. This is illustrated in FIG. 4B by the 4 dummy bits preceding the 12 bit address on the SI line. In a second embodiment, dummy bits may be transmitted from the master device 102 as a dummy trailer for proper data transmission alignment. This is illustrated in FIG. 4B on the SI line by the dummy byte following the 12 bit address. Once the slave device 104 receives the data address from the master device 102, the slave device 104 accesses the cache memory 110 and transmits the corresponding data on the SO line, as illustrated in FIG. 4B. This data is received by the master device 102 in step 406 of FIG. 4A.

Figure 5:
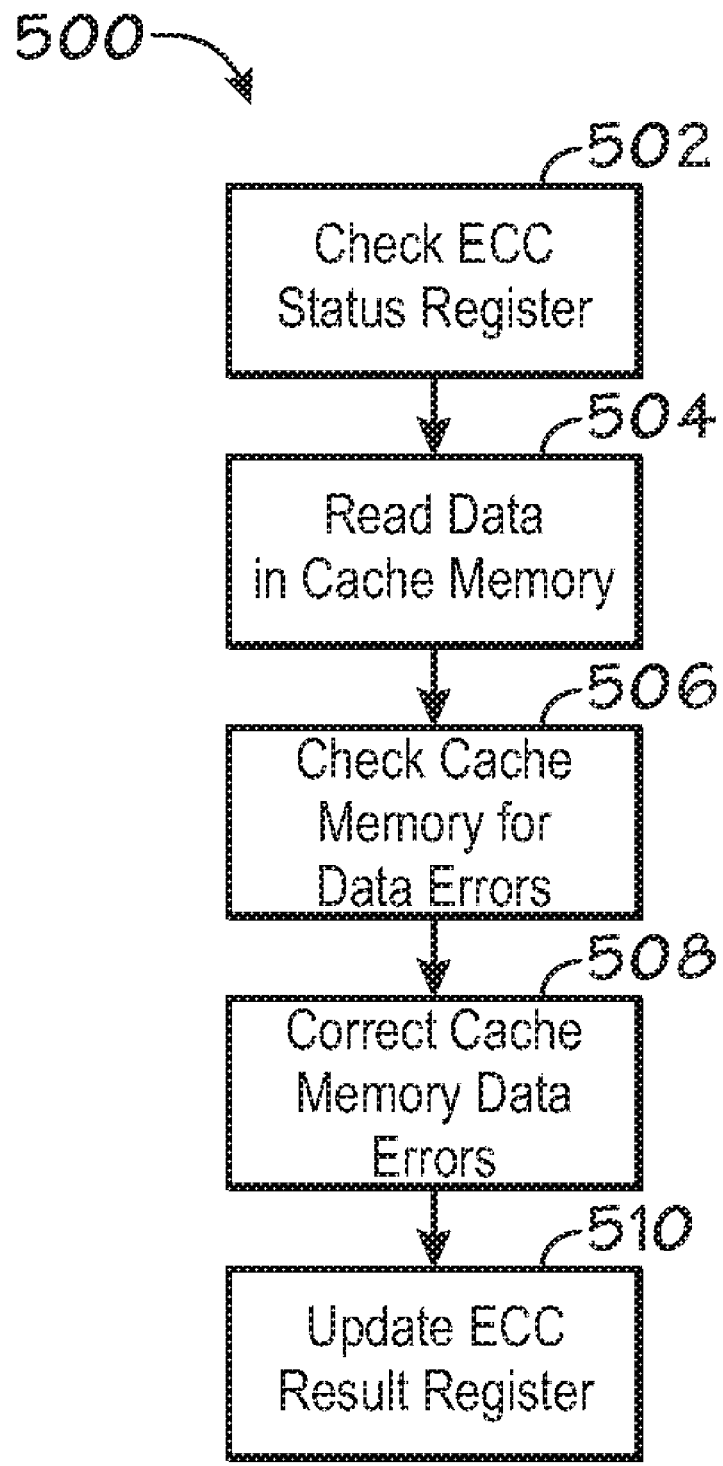
FIG. 5 is a flow chart illustrating a method for error detection and correction of data stored in a cache memory in accordance with an embodiment of the invention.

FIG. 5 represents an embodiment that allows for error detection and correction method 500 for the cache memory 110. In one embodiment, after step 208 of FIG. 2A, or similarly during step 310 of FIG. 3, the SPI NAND controller 106 performs error detection and correction of the data in the cache memory 110. At step 502, the SPI NAND controller 106 checks the ECC status register 118 across access line 120. The ECC status register 118 includes an ECC enable/disable register. When the ECC enable/disable register is set to disable, no error detection or correction occurs. If, however, the ECC enable/disable register is set to enable, then the SPI NAND controller 106 checks an ECC size register. The ECC size register stores information defining the size of the region on which the ECC algorithm is to be performed. For example, ECC may be performed on each 512 bytes, each 1024 bytes, or any amount of bytes in the cache up to the page size. After the ECC size register is accessed, the SPI NAND controller proceeds to step 504.

In step 504, the SPI NAND controller 106 reads the data of the page selected by the master device 102 in the cache memory 110 using the access line 116. The SPI NAND controller 106 also reads the error correction redundancy bits associated with the selected page using the access line 116. In one embodiment, redundancy bits are stored with the data bits in the page. In a second embodiment, redundancy bits associated with the data in the selected page are stored in a secondary location in the cache memory 110.

In step 506, the SPI NAND controller 106 checks the data read in step 502 by implementing an error detection process. The error detection process uses the redundancy bits corresponding to the data in detecting any errors in the data. If any errors are found, then they are corrected in step 508 using the ECC process. In one embodiment, the error detection and correction techniques make use of linear block encoding and decoding. A further embodiment utilizes specialized subclasses of binary BCH codes, such as Hamming codes to perform the error detection and correction. A third embodiment utilizes nonbinary BCH codes, such as Reed-Solomon codes to perform the error detection and correction of the data. Upon completion of steps 506 and 508, the data is sent across access line 116.

In step 510, the ECC result register 118 is updated. Preferably, the ECC status register 118 includes sub-registers used to store error detection and correction result information. In one embodiment, updating the ECC result register 118 includes storing the types of error detected and corrected in an ECC type register. For example, values corresponding to no errors, one error detected and corrected, or two errors detected and one error corrected, could be stored in the ECC type register. In another embodiment, step 510 includes updating an ECC NAND memory result register that stores information regarding the result of any error correction process on the cache memory 110. A further embodiment of step 510 includes updating an ECC NAND memory result register with information regarding the result of any error correction process on both the main portion of the cache memory as well as the spare portion of the cache memory 110. The information updated in the ECC result register 118, and its sub-registers, is available for access by the master device 102 or by the slave device 104.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device, comprising:
a serial peripheral interface NAND controller adapted to receive an activate signal, a timing signal, and a serial data in signal, wherein the serial peripheral interface NAND controller is further adapted to transmit the serial in data signal without translation into standard NAND format; and
a NAND memory adapted to receive the serial data in signal transmitted from the serial peripheral interface NAND controller.

2. The memory device of claim 1, comprising a cache memory coupled to the serial peripheral interface NAND controller and the NAND memory, wherein the cache memory is adapted to transmit data from the serial peripheral interface NAND controller to the NAND memory, and wherein the cache memory is further adapted to transmit data from the NAND memory to the serial peripheral interface NAND controller.

3. The memory device of claim 1, comprising an error correction status register coupled to the serial peripheral interface NAND controller.

4. The memory device of claim 3, wherein the error correction status register is adapted to store error types for the cache.

5. The memory device of claim 3, wherein the error correction status register is adapted to store error correction enable and disable information.

6. The memory device of claim 3, wherein the error correction status register is adapted to store information defining the size of the region on which the ECC algorithm is to be performed.

7. The memory device of claim 1, wherein the serial peripheral interface NAND controller is adapted to perform error correction on data stored in the cache memory.

8. The memory device of claim 7, wherein performing error correction on data stored in the cache memory comprises:
reading data in the cache memory;
detecting errors in the data; and
updating an error correction status register.

9. The memory device of claim 7, wherein performing error correction on data stored in the cache memory comprises:
reading data in the cache memory;
detecting errors in the data;
correcting at least one error in the data; and
updating an error correction status register.

10. A method for accessing a serial peripheral interface NAND memory device, comprising:
setting a chip select to low in a host device;
transmitting a page read command to the serial peripheral interface NAND memory device;
transmitting a page address to the serial peripheral interface NAND memory device, wherein the page address is sent to a NAND memory in the serial peripheral interface NAND memory device without translation of the page address into standard NAND format; and
setting a chip select to high in the host device.

11. The method of claim 10, further comprising:
setting the chip select to low in the host device;
transmitting a read status command to the serial peripheral interface NAND memory device; and
receiving a read status bit from the serial peripheral interface NAND memory device.

12. The method of claim 11, further comprising:
transmitting a data read command to the serial peripheral interface NAND memory device;
transmitting a data address to the serial peripheral interface NAND memory device; and
receiving data from the serial peripheral interface NAND memory device.

13. The method of claim 12, wherein receiving data comprises receiving data that has been checked by an error correction process.

14. The method of claim 10, further comprising:
waiting a predetermined time;
setting the chip select to low in the host device;
transmitting a data read command to the serial peripheral interface NAND memory device;
transmitting a data address to the serial peripheral interface NAND memory device; and
receiving data from the serial peripheral interface NAND memory device.

15. The method of claim 14, wherein receiving data comprises receiving data that has been checked by an error correction process.

16. A method of operating a serial peripheral interface NAND memory device, comprising:
providing a timing signal comprising a plurality of clock cycles;
providing an activate signal; and
providing a serial data in signal, wherein the data transmitted across the serial data in signal is input to NAND memory in a modified serial peripheral interface NAND format.

17. The method of claim 16, further comprising receiving a serial data out signal, wherein receiving the serial data out signal comprises receiving data output from the NAND memory in the modified serial peripheral interface format.

18. The method of claim 16, further comprising receiving data output from the NAND memory that has been checked by an error correction process.

19. A method for accessing a serial peripheral interface NAND memory device, comprising:
transmitting a page read command to the serial peripheral interface NAND memory device;
transmitting a page address to the serial peripheral interface NAND memory device, wherein the page address is sent to a NAND memory in the serial peripheral interface NAND memory device in a modified serial peripheral interface NAND format;
transmitting a data page associated with the page address to a cache memory from the NAND memory;
performing an error detection and correction algorithm on the data page stored in the cache memory;
transmitting a data read command to the serial peripheral interface NAND memory device;
transmitting a data address to the serial peripheral interface NAND memory device; and
receiving data from the serial peripheral interface NAND memory device.

20. The method of claim 19, wherein performing the error detection and correction algorithm comprises using a linear block code to detect and correct errors in the data.

21. The method of claim 19, wherein the error detection and correction algorithm comprises using a BCH code, a Hamming code, or a Reed-Solomon code.

22. The method of claim 19, wherein performing the error detection and correction algorithm includes updating an ECC NAND memory result register.

23. A method for accessing a serial peripheral interface NAND memory device, comprising:
- transmitting a page read command to the serial peripheral interface NAND memory device;
- transmitting a page address to the serial peripheral interface NAND memory device, wherein the page address is sent to a NAND memory in the NAND memory device in a modified serial peripheral interface NAND format;
- transmitting a data page associated with the page address to a cache memory from the NAND memory device;
- performing an error detection and correction algorithm on the data page stored in the cache memory;
- transmitting a data read command to the serial peripheral interface NAND memory device;
- transmitting a data address to the serial peripheral interface NAND memory device; and
- receiving data from the serial peripheral interface NAND memory device.

24. The method of claim 23, wherein performing the error detection and correction algorithm comprises using a BCH code, a Hamming code, or a Reed-Solomon code.

25. The method of claim 23, wherein performing the error detection and correction algorithm includes updating an ECC NAND memory result register.

* * * * *